(12) United States Patent
Tserng et al.

(10) Patent No.: US 8,008,977 B2
(45) Date of Patent: Aug. 30, 2011

(54) FIELD-PLATED TRANSISTOR INCLUDING FEEDBACK RESISTOR

(75) Inventors: Hua-Quen Tserng, Dallas, TX (US); David Michael Fanning, Garland, TX (US)

(73) Assignee: Triquint Semiconductor, Inc., Hillsboro, OR (US)

(*) Notice: Subject to any disclaimer, the term of this patent is extended or adjusted under 35 U.S.C. 154(b) by 5 days.

(21) Appl. No.: 12/423,772

(22) Filed: Apr. 14, 2009

(65) Prior Publication Data

US 2010/0259329 A1   Oct. 14, 2010

(51) Int. Cl.
*H03F 3/04*   (2006.01)
(52) U.S. Cl. ........................................ 330/311; 330/277
(58) Field of Classification Search .................. 330/277, 330/310–311; 257/76, 288, 379, 194
See application file for complete search history.

(56) References Cited

U.S. PATENT DOCUMENTS

| | | | |
|---|---|---|---|
| 6,867,078 | B1 | 3/2005 | Green et al. |
| 7,126,426 | B2 * | 10/2006 | Mishra et al. ................. 330/307 |
| 2005/0062069 | A1 | 3/2005 | Saito et al. |
| 2005/0116253 | A1 | 6/2005 | Yamane et al. |
| 2005/0253168 | A1 | 11/2005 | Wu et al. |
| 2006/0006415 | A1 | 1/2006 | Wu et al. |
| 2006/0043416 | A1 | 3/2006 | Li et al. |
| 2006/0118809 | A1 | 6/2006 | Parikh et al. |
| 2006/0138454 | A1 | 6/2006 | Saito et al. |
| 2006/0202272 | A1 | 9/2006 | Wu et al. |
| 2007/0018210 | A1 | 1/2007 | Sheppard |
| 2007/0114569 | A1 | 5/2007 | Wu et al. |
| 2007/0235775 | A1 | 10/2007 | Wu |
| 2007/0272957 | A1 | 11/2007 | Johnson |
| 2008/0116492 | A1 | 5/2008 | Wu et al. |
| 2009/0032820 | A1 * | 2/2009 | Chen ............................. 257/76 |
| 2009/0256210 | A1 * | 10/2009 | Matsushita et al. ........... 257/379 |

FOREIGN PATENT DOCUMENTS

| | | |
|---|---|---|
| JP | 2009-032724 A | 2/2009 |
| WO | WO2008006907 A1 | 6/2008 |

OTHER PUBLICATIONS

Ando, et al.; Novel AlGaN/GaN Dual-Field Plate FET with High Gain, Increased Linearity and Stability; article; 4 pages; 2005 IEEE; Aug. 2005.
Chiu, et al.; Microwave performance of AlGaAs/InGaAs pseudomorphic HEMTs with tuneable field-plate voltage; Semicond. Sci. Teachnol. 21, No. 10; pp. 1432-1436; 2006.
Ishikura, K., et al.; A 28V over 300 W GaAs Heterojunction FET with Dual Field-Modulating-Plates for W-CDMA Base Stations; article; 4 pages; 2005 IEEE; Jan. 2005.
Verzellesi, et al.; DC-to-RF dispersion effects in GaAs- and GaN-based heterostructure FETs; performance and reliability issues; Microelectronics Reliability 45, pp. 1585-1592; 2005.
Wakejima, et al.; A GaAs-Based Field-Modulating Plate HFET with Improved WCDMA Peak-Output-Power Characteristics; IEEE Transactions on Electrode Devices, vol. 50, No. 9, pp. 1983-1987; 2003.
Wu, Y.F.; et al., High-gain Microwave GaN HEMTs with Source-terminated Field-plates; article; pp. 33.7.1-33.7.2; 2004 IEEE; Jan. 2004.
Xing, et al.; High Breakdown Voltage AlGaN-GaN HEMTs Achieved by Multiple Field Plates; article; pp. 161-163; IEEE Electron Device Letters, vol. 25, No. 4; Apr. 2004.

* cited by examiner

*Primary Examiner* — Hieu P Nguyen
(74) *Attorney, Agent, or Firm* — Schwabe Williamson & Wyatt

(57) ABSTRACT

Embodiments include but are not limited to apparatuses and systems including a unit cell having a source electrode, a gate electrode to receive an input radio frequency (RF) signal, and a drain electrode to output an amplified RF signal. A field plate may be coupled with the source electrode, and a feedback resistor may be coupled between the field plate and the source electrode.

8 Claims, 8 Drawing Sheets

FIELD-PLATED TRANSISTOR INCLUDING FEEDBACK RESISTOR

TECHNICAL FIELD

Embodiments of the present invention relate generally to microelectronic devices, and more particularly to field-plated transistors including a feedback resistor and circuits incorporating the same.

BACKGROUND

Power amplifiers including one or more of various types of field effect transistors may be used for converting dc-input power into radio frequency (RF) power. At high voltages, the amplifiers may have a tendency for out-of-band high-frequency oscillation due to a negative resistance band at the output of the amplifier. Under RF drives, this high-frequency oscillation may manifest itself as spurious signals at in-band frequencies near the carrier frequencies. For high-power microwave systems (e.g., radar and wireless communications applications), it generally is desirable for the frequency spectrum to be free of these spurious signals at all frequencies.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a surface of another layer.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present invention may be shown and described as including a particular number of components or elements, embodiments of the invention are not limited to any particular number of components or elements.

Figure 1:
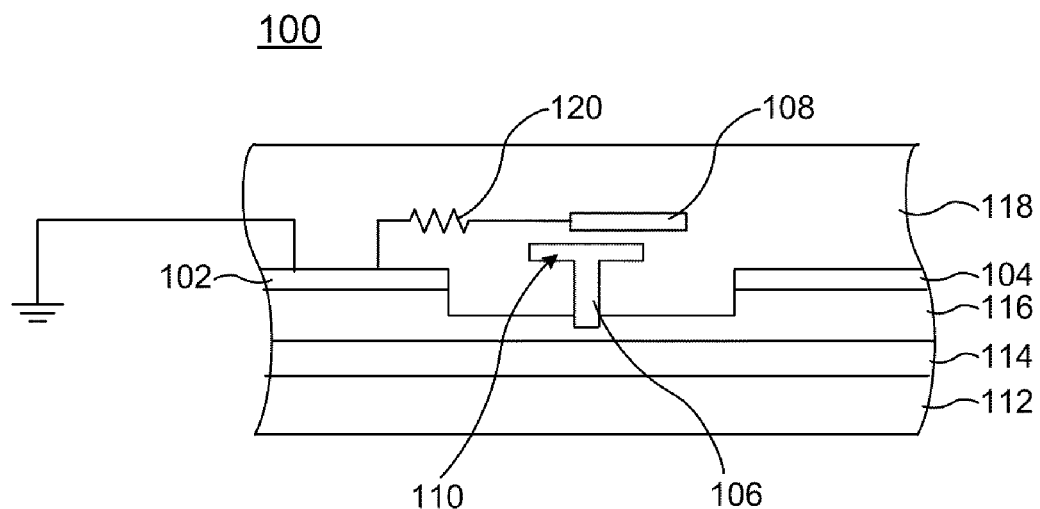
FIG. 1 is a sectional view of a transistor including a feedback resistor in accordance with various embodiments.

Turning now to FIG. 1, illustrated is a cross-sectional view of a transistor 100 including a source electrode 102, a drain electrode 104, and a gate electrode 106. Further, the transistor 100 includes a field plate 108. The gate electrode 106 may also include a field plate 110, integrally formed with the gate electrode 106 as illustrated (this structure may be referred to as a T-gate).

The source electrode 102 may be configured to couple with a ground source, and the field plate 108 may be electrically coupled with the source electrode 102. Source grounding the field plate 108 may provide a shielding effect between the gate electrode 106 and the drain electrode 104. Such shielding may advantageously reduce the gate-to-drain capacitance of the transistor 100 and also possibly increase power gains achieved by the transistor 100.

The transistor 100 may be any one of various field-effect transistors (FET) suitable for microwave- or millimeter-wave power amplification applications. Examples of FETs may include a high electron mobility transistor (HEMT) (e.g., an aluminum gallium nitride (AlGaN)/gallium nitride (GaN) HEMT), a pseudomorphic HEMT (pHEMT) (e.g., a gallium arsenide (GaAs) pHEMT), a metamorphic HEMT (mHEMT) (e.g., a GaAs mHEMT), a laterally diffused metal oxide semiconductor transistor (LDMOS), or a metal epitaxial semiconductor field effect transistor (MESFET).

As illustrated, the transistor 100 is generally a FET including a barrier layer 116 and a channel layer 114 formed on a substrate 112. The substrate 112 may comprise any material suitable for the application. For various embodiments, for example, the substrate 112 comprises GaAs. In other embodiments, however, the substrate 112 may comprise GaN. Another material or combination of materials may be similarly suitable. For example, the substrate 112 may comprise silicon carbide, silicon, sapphire, aluminum nitride, or some combination thereof or some combination with another suitable material.

The channel layer 114 may comprise one or more layers with a desired band gap. In various embodiments, the channel layer 114 may comprise one or more doped or undoped GaAs layers or indium gallium arsenide (InGaAs) layers. Other materials may be similarly suitable including, for example, GaN. In various embodiments, the channel layer 114 may comprise the same material as the substrate 112. In other embodiments, however, the channel layer 114 may comprise a material different than the material forming the substrate 112.

The barrier layer 116 may comprise any material suitable for the application. In various embodiments, the barrier layer 116 comprises aluminum gallium arsenide (AlGaAs). Another material or combination of materials may be similarly suitable. For example, the barrier layer 116 may comprise AlGaN. The barrier layer 116 may be doped or undoped, depending on the application.

The gate electrode 106 may be partially recessed into barrier layer 116 as illustrated. The distance the gate electrode 106 is recessed may depend on the desired frequency operation of the transistor 100. For example, in some embodiments wherein the transistor 100 is to be operated at a frequency of approximately 3.5 GHz, the gate electrode 106 may have a gate length of approximately 0.6 to 0.7 microns and may be recessed approximately 200 Angstroms. In various other embodiments, the gate electrode 106 may be recessed further into the barrier layer 116 or may instead not be recessed at all.

The transistor 100 may include a dielectric material 118 formed over one or more layers of the transistor 100. In the illustrated embodiments, the dielectric material 118 is formed over the source electrode 102, the drain electrode 104, the field plate 108, and also over portions of the gate electrode 106 and the barrier layer 116. The dielectric material 118 may also be formed between the field plate 108 and the gate electrode 106 as illustrated.

The dielectric material 118 may be formed as a plurality of layers, the layers comprising layers of the same material or layers of two or more different materials. In various embodiments, one or more layers of the dielectric material 118 comprise silicon nitride or silicon dioxide. Other dielectric material may be similarly suitable.

In various embodiments, a feedback resistor 120 may be coupled between the field plate 108 and the source electrode 102, and may result in high-frequency oscillation stabilization. In various embodiments, oscillation stabilization may be realized on the output of the transistor 100 (i.e., at the drain electrode 104) using a feedback resistor 120 having a resistance of as low as several ohms or more. For example, a 4×250 micron (i.e., four gate finger unit cell, each gate electrode having a 250 micron gate width) high-voltage pHEMT may be stabilized using a feedback resistor 120 having a resistance of 3 to 4 ohms. In various embodiments, the resistance of the feedback resistor 120 may have any suitable resistance for achieving a desired degree of high frequency oscillation stabilization.

Figure 2:
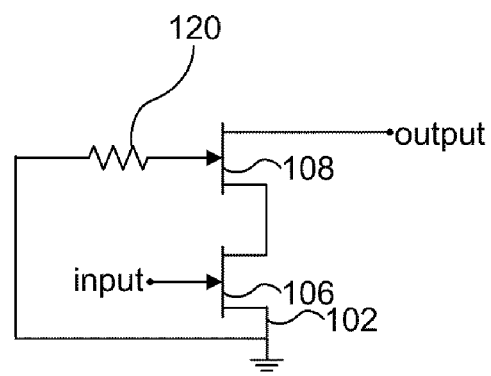
FIG. 2 is a circuit diagram of the transistor of FIG. 1.

As illustrated, the field plate 108 is proximately disposed to the gate electrode 106, and is offset relative to and overhanging the gate electrode 106 toward the drain electrode 104. In effect, this orientation can be considered a cascode arrangement including cascaded common source and common gate transistors, with the gate electrode 106 operating as a gate of a common source transistor, and the field plate 108 operating as a gate of a common gate transistor. This arrangement may be understood more clearly with reference to the cascode equivalent circuit representation depicted in FIG. 2, which shows the gate electrode 106, the field plate 108, and the feedback resistor 120 coupled between the field plate 108 and the grounded source electrode 102. The field plate 108 essentially forms a metal-insulator-semiconductor transistor comprising the portion of the field plate 108 overhanging the gate electrode 106, the dielectric material 118, and the underlying semiconductor material (i.e., the barrier layer 116 and the channel layer 114).

The field plate 108 may comprise any material suitable for the purpose. According to various embodiments, the field plate 108 may comprise gold (Au), nickel-gold (Ni—Au), or titanium-platinum-gold (Ti/Pt/Au). Other metals may be similarly suitable, depending on the application.

The transistor 100 may be included in a unit cell of a power amplifier circuit, with the gate electrode 106 configured to receive an input radio frequency (RF) signal, and the drain electrode 104 configured to output an amplified RF signal. In various embodiments, a unit cell may comprise one or more of the transistors described herein. In reality, a unit cell may comprise a plurality of transistors connected in parallel for increased power.

Figure 3:
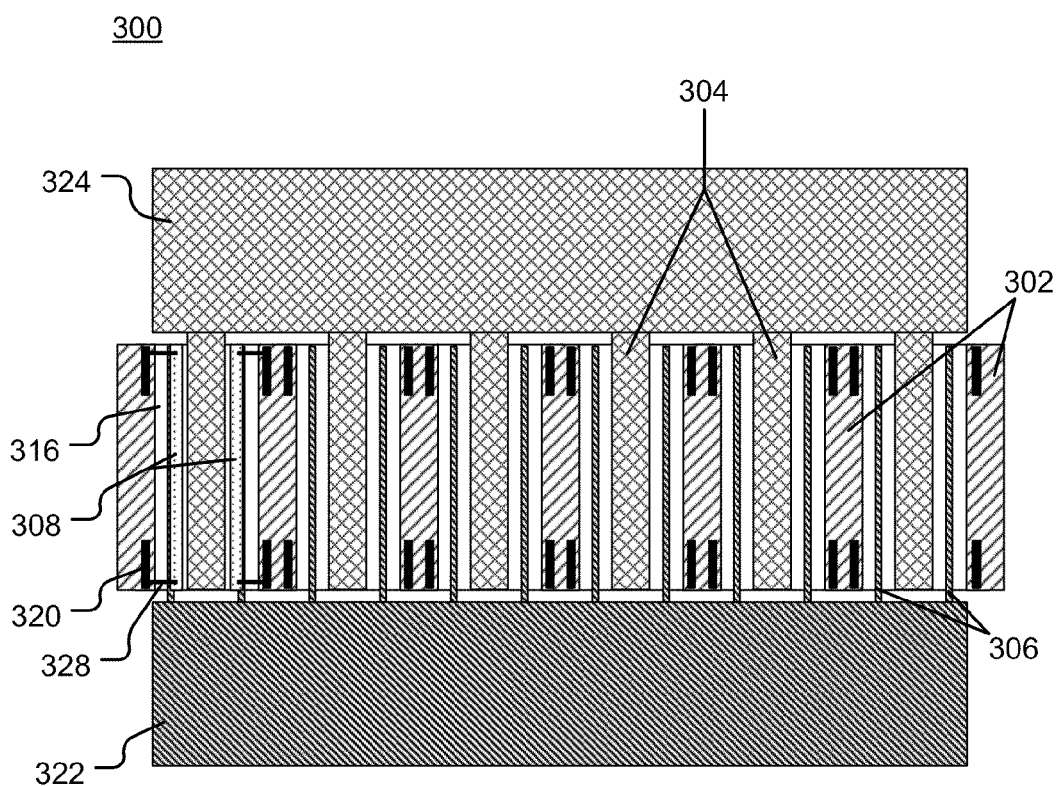
FIG. 3 is a top view of a unit cell including a plurality of transistors including feedback resistors in accordance with various embodiments.

As illustrated in FIG. 3, for example, a unit cell 300 includes a gate structure 322 including a plurality of gate electrodes 306 (i.e., gate fingers) on or recessed in a barrier layer 316; a drain structure 324 including a plurality of drain electrodes 304 (i.e., drain fingers); and a plurality of source electrodes 302 (i.e., source fingers). The source electrodes 302 may be interconnected by a source interconnect bridge (not illustrated).

Each of the individual transistors may be formed by one of the source electrodes 302, one of the gate electrodes 306, and one of the drain electrodes 304. In addition, as discussed herein, a field plate 308 may form a common gate transistor cascaded in cascode arrangement with the common source transistor formed by a source electrode 302/gate electrode 306/drain electrode 304 set. For simplicity, only two field plates 308 are illustrated in FIG. 3. In various embodiments, the unit cell 300 may include a plurality of field plates 308, one or more of the field plates 308 disposed in proximity to the gate electrodes 306.

The unit cell 300 may also include a plurality of feedback resistors 320, with at least one feedback resistor 320 being coupled with one or more of the field plates 308. The size, shape, and location of the feedback resistors 320 as illustrated is for example purposes only, and it is contemplated that the size, shape, and/or location of the feedback resistors 320 may be varied without deviating from the scope of the various described embodiments. The feedback resistors 320 may be coupled with the field plates 308 using any suitable interconnection 328.

Figure 4:
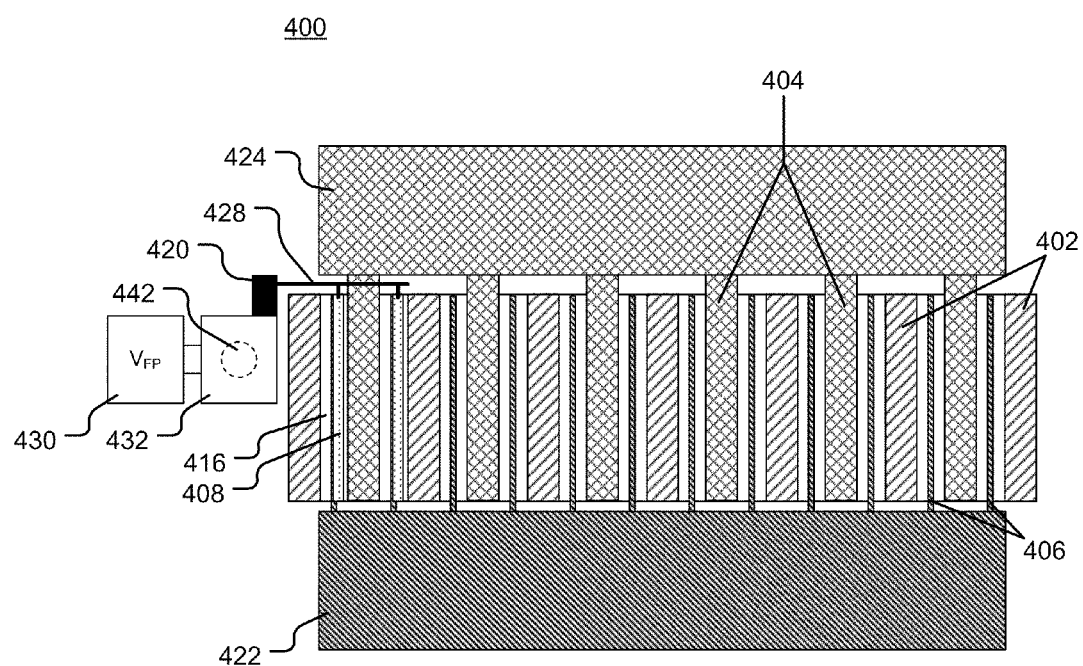
FIG. 4 is a top view of another unit cell including a plurality of transistors including a feedback resistor in accordance with various embodiments.

In various embodiments, the feedback resistor 320 may be situated externally to the area including the source electrodes 302, gate electrodes 306, and drain electrodes 304. Take, for example, the unit cell 400 illustrated in FIG. 4. The unit cell 400 includes a gate structure 422 including a plurality of gate electrodes 406 (i.e., gate fingers) on or recessed in a barrier layer 416; a drain structure 424 including a plurality of drain electrodes 404 (i.e., drain fingers); and a plurality of source electrodes 402 (i.e., source fingers). Rather than situating the feedback resistor 420 within the area occupied by the source electrodes 402, gate electrodes 406, and drain electrodes 404, the feedback resistor 420 is situated externally to that area and connected to the field plates 408 by a suitable interconnection 428.

Figure 5:
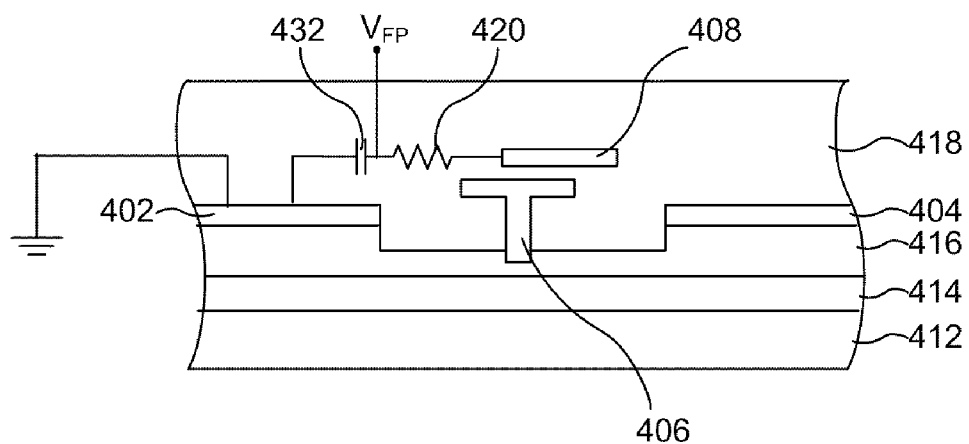
FIG. 5 is a sectional view of a transistor of the unit cell of FIG. 4.
Figure 6:
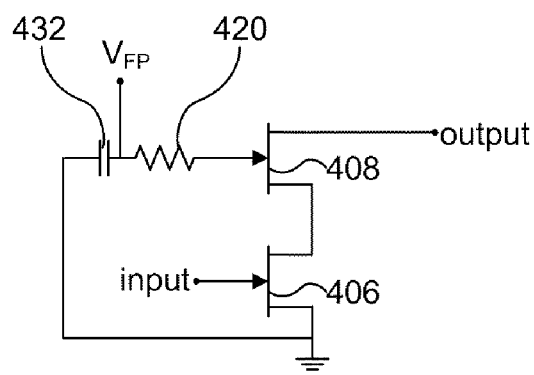
FIG. 6 is a circuit diagram of the transistor of FIG. 5.

FIG. 5 illustrates a cross-sectional view of a transistor 500 of the unit cell 400, and FIG. 6 illustrates the cascode equivalent circuit representation. As illustrated, the transistor 500 includes some of the features of transistors described herein including, for example, a barrier layer 416 and a channel layer 414 formed on a substrate 412, and a dielectric material 418 overlying the same.

The unit cell 400 may also be configured with tunable feedback for linearization and gain enhancement. To that end, the unit cell 400 may be configured to couple with a voltage source by way of a bias pad 430 for receiving a tuning voltage $V_{FP}$. The unit call 400 may further include a by-pass capacitor 432 coupled to a grounding via 442 under the by-pass capacitor 432.

Figure 7:
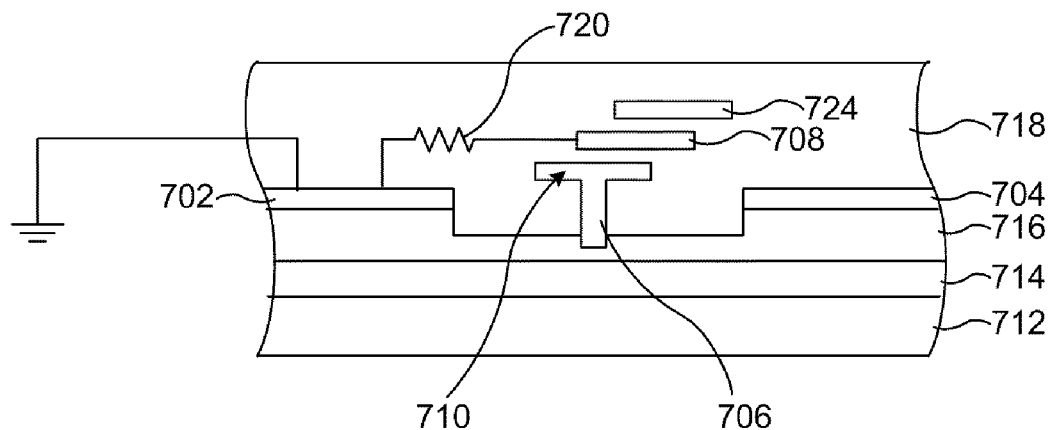
FIG. 7 is a sectional view of another transistor including a feedback resistor in accordance with various embodiments.

Transistors in accordance with various embodiments may include more than one field plate. As illustrated in FIG. 7, the transistor 700 includes some of the features of the transistor 100 illustrated in FIG. 1 including, for example, a source electrode 702, a drain electrode 704, and a gate electrode 706. The transistor 700 includes a barrier layer 716 and a channel layer 714 formed on a substrate 712, and a dielectric material 718 overlying the same.

The transistor 700 also includes a first field plate 708. Instead of just a single field plate 708 (in addition to the integral field plate 710 of the gate electrode 706), the transistor 700 includes a second field plate 724. The second field plate 724 is proximately disposed to the first field plate 708, and is offset relative to and overhanging the first field plate 708 and the gate electrode 706 toward the drain electrode 704. As illustrated, a feedback resistor 720 is coupled between the first field plate 708 and the source electrode 702, while the second field plate 724 is floating.

The first and second field plates 708, 724 may comprise any material suitable for the purpose. According to various embodiments, the first and second field plates 708, 724 may comprise Au, Ni—Au, or Ti/Pt/Au. Other metals may be similarly suitable, depending on the application. The first and second field plates 708, 724 need not be comprised of the same material.

Figure 8:
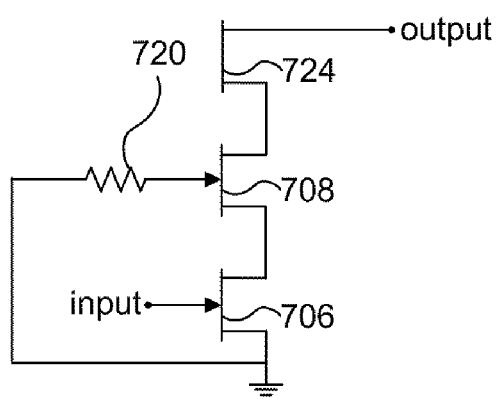
FIG. 8 is a circuit diagram of the transistor of FIG. 7.

The cascode equivalent circuit representation of the structure of FIG. 7 is illustrated in FIG. 8. Like the first field plate 708, the second field plate 724 essentially forms a metal-insulator-semiconductor transistor comprising the portion of the second field plate 724 overhanging the first field plate 708 and the gate electrode 706, the dielectric material 718, and the underlying semiconductor material (i.e., the barrier layer 716 and the channel layer 714).

Figure 9:
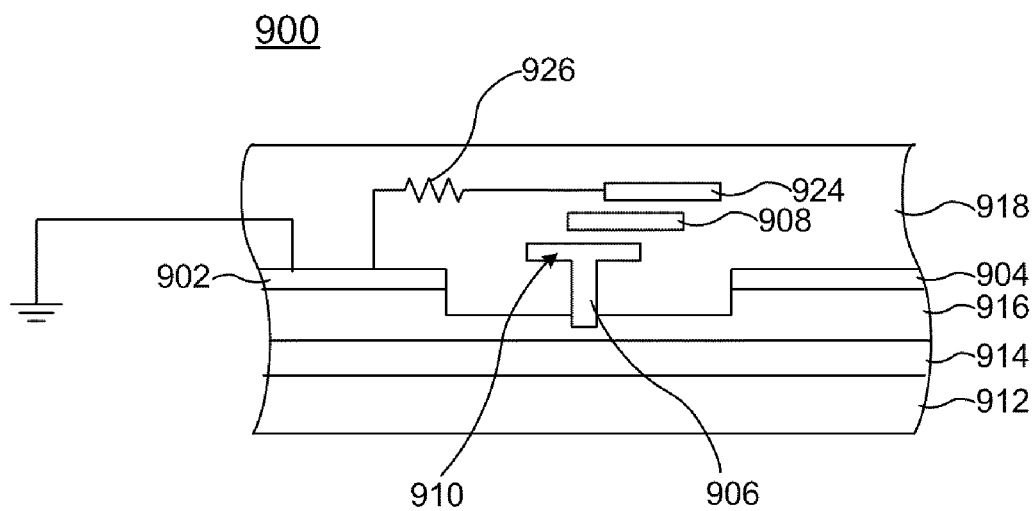
FIG. 9 is a sectional view of another transistor including a feedback resistor in accordance with various embodiments.
Figure 10:
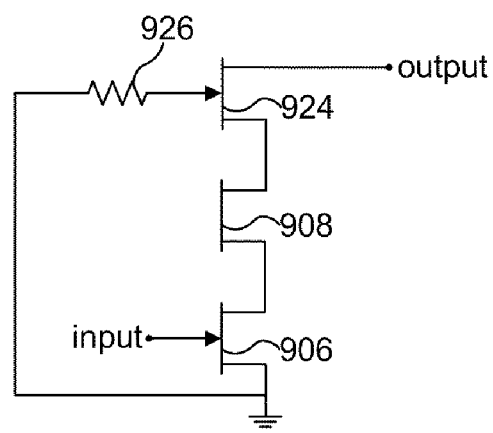
FIG. 10 is a circuit diagram of the transistor of FIG. 9.

Another example transistor is illustrated in FIG. 9, and its cascode equivalent circuit representation is illustrated in FIG. 10. As illustrated, the transistor 900 includes some of the features of the transistors described herein including, for example, a source electrode 902, a drain electrode 904, and a gate electrode 906. The transistor 900 includes a barrier layer 916 and a channel layer 914 formed on a substrate 912, and a dielectric material 918 overlying the same.

The transistor 900 also includes a first field plate 908. Instead of just a single field plate 908 (in addition to the integral field plate 910 of the gate electrode 906), the transistor 900 includes a second field plate 924. The second field plate 924 is proximately disposed to the first field plate 908, and is offset relative to and overhanging the first field plate 908 and the gate electrode 906 toward the drain electrode 904. Rather than being coupled between the first field plate 908 and the source electrode 902, a feedback resistor 926 is coupled between the second field plate 924 and the source electrode 902, while the first field plate 908 is floating.

Figure 11:
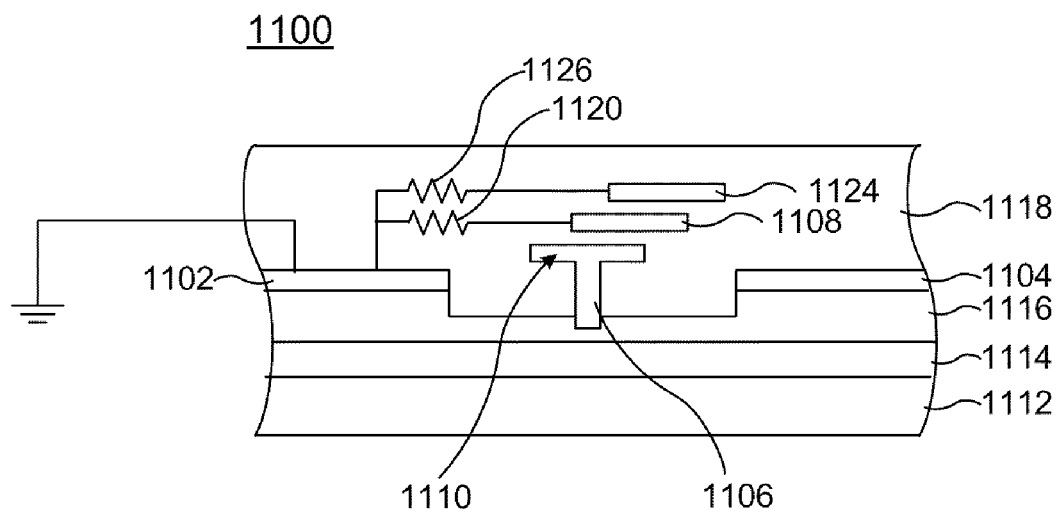
FIG. 11 is a sectional view of another transistor including a feedback resistor in accordance with various embodiments.
Figure 12:
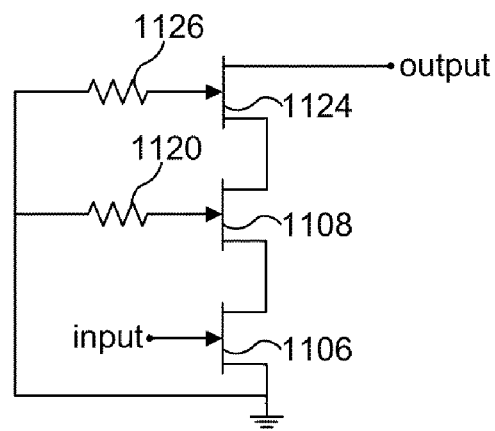
FIG. 12 is a circuit diagram of the transistor of FIG. 11.

Still another example transistor is illustrated in FIG. 11, and its cascode equivalent circuit representation is illustrated in FIG. 12. As illustrated, the transistor 1100 includes some of the features of the transistors described herein including, for example, a source electrode 1102, a drain electrode 1104, and a gate electrode 1106. The transistor 1100 includes a barrier layer 1116 and a channel layer 1114 formed on a substrate 1112, and a dielectric material 1118 overlying the same.

The transistor 1100 also includes a first field plate 1108 and a second field plate 1124, in addition to the integral field plate 1110 of the gate electrode 1106. Rather than including a feedback resistor between only one of the field plates 1108, 1124 and the source electrode 1102, the transistor 1100 includes a first feedback resistor 1120 coupled between the first field plate 1108 and the source electrode 1102, and a second feedback resistor 1126 coupled between the second field plate 1124 and the source electrode 1102.

Figure 13:
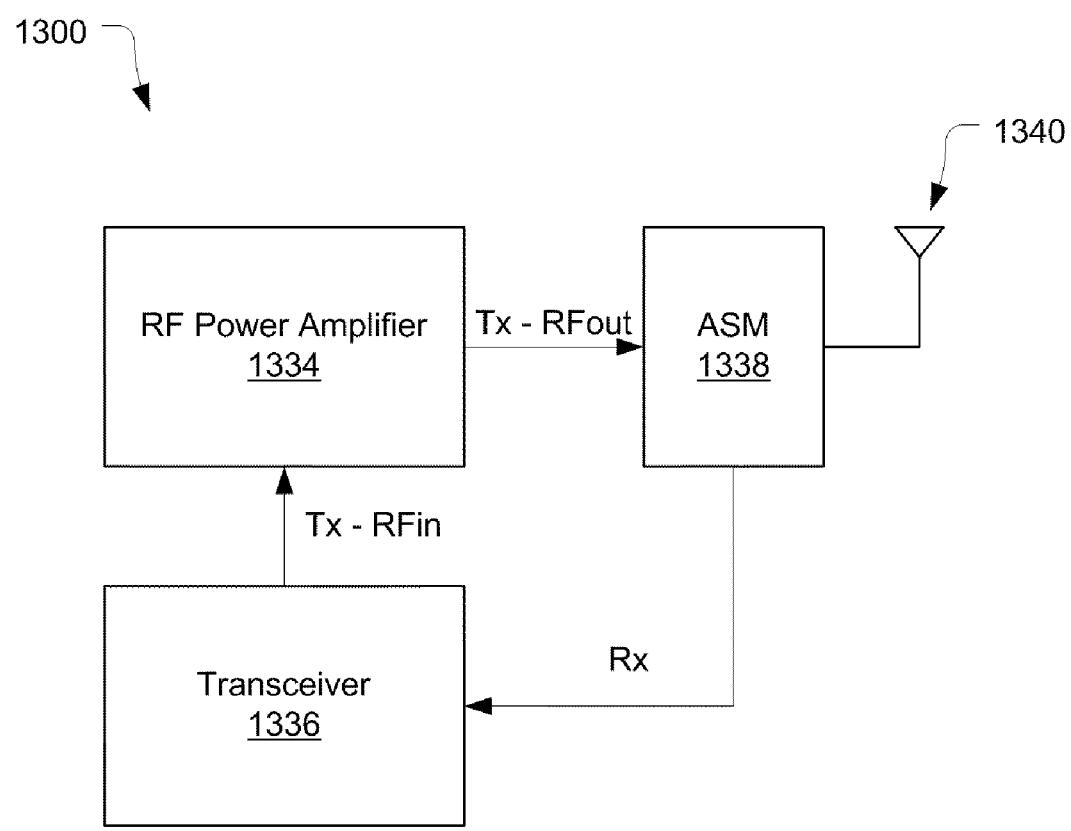
FIG. 13 is a block diagram of a system incorporating a unit cell including a feedback transistor in accordance with various embodiments.

Embodiments of packages described herein may be incorporated into various apparatuses and systems. A block diagram of an exemplary system 1300 is illustrated in FIG. 13. As illustrated, the system 1300 includes an RF power amplifier 1334 comprising one or more transistors including a feedback transistor. The system 1300 may include a transceiver 1336 coupled with the RF power amplifier 1334 as shown.

The RF power amplifier 1334 may receive an RF input signal, RFin, from the transceiver 1336. The RF power amplifier 1334 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 13.

The amplified RF output signal, RFout, may be provided to an antenna switch module (ASM) 1338, which effectuates an over the air (OTA) transmission of the RF output signal, RFout, via an antenna structure 1340. The ASM 1338 may also receive RF signals via the antenna structure 1340 and couple the received RF signals, Rx, to the transceiver 1336 along a receive chain.

In various embodiments, the antenna structure 1340 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1300 may be any system including power amplification. In various embodiments, the system 1300 may be particularly useful for power amplification at high radio frequency power and frequency. For example, the system 1300 may be suitable for any one or more of terrestrial and satellite communications, radar systems, and possibly in various industrial and medical applications. Radar applications may include military-use radar, air traffic control, navigation, and the like.

In various embodiments, the system 1300 may be a selected one of a radar device, a satellite communication device, a mobile handset, a cellular telephone base station, a broadcast radio, or a television amplifier system. The system 1300 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
a unit cell including a source electrode, a gate electrode to receive an input radio frequency (RF) signal, and a drain electrode to output an amplified RF signal;
a first field plate coupled with the source electrode;
a second field plate coupled with the source electrode; and
a feedback resistor coupled between the first field plate and the source electrode.

2. The apparatus of claim 1, wherein the source electrode is configured to couple with a ground voltage.

3. The apparatus of claim 1, wherein the source electrode is configured to couple with a ground voltage.

4. The apparatus of claim 1, wherein the first field plate is offset relative to the gate electrode toward the drain electrode, and the second field plate is offset relative to the first field plate toward the drain electrode.

5. The apparatus of claim 1, wherein the source electrode, the gate electrode, and the drain electrode form a transistor, and wherein the unit cell includes a plurality of other transistors similarly constituted and connected in parallel with the transistor.

6. The apparatus of claim 5, wherein the transistor is a field effect transistor (FET).

7. The apparatus of claim 6, wherein the transistor is a FET selected from the group consisting of a high electron mobility transistor (HEMT), a pseudomorphic high electron mobility transistor (pHEMT), a laterally diffused metal oxide semiconductor transistor (LDMOS), and a metal epitaxial semiconductor field effect transistor (MESFET).

8. The apparatus of claim 1, wherein the gate electrode is a T-gate.

* * * * *